US012684703B2

(12) United States Patent
Chen et al.

(10) Patent No.: US 12,684,703 B2
(45) Date of Patent: Jul. 14, 2026

(54) METHOD FOR MANUFACTURING A PACKAGING SUBSTRATE, AND PACKAGING SUBSTRATE

(71) Applicant: Zhuhai ACCESS Semiconductor Co., Ltd., Zhuhai City (CN)

(72) Inventors: Xianming Chen, Zhuhai City (CN); Lei Feng, Zhuhai City (CN); Benxia Huang, Zhuhai City (CN); Wenjian Lin, Zhuhai City (CN); Gao Huang, Zhuhai City (CN)

(73) Assignee: ZHUHAI ACCESS SEMICONDUCTOR CO., LTD., Guangdong (CN)

( * ) Notice: Subject to any disclaimer, the term of this patent is extended or adjusted under 35 U.S.C. 154(b) by 651 days.

(21) Appl. No.: 18/145,349

(22) Filed: Dec. 22, 2022

(65) Prior Publication Data

US 2023/0232545 A1     Jul. 20, 2023

(30) Foreign Application Priority Data

Jan. 20, 2022    (CN) .......................... 202210069428.6

(51) Int. Cl.
| | |
|---|---|
| *H05K 3/46* | (2006.01) |
| *H05K 1/185* | (2026.01) |
| *H05K 3/00* | (2006.01) |

(52) U.S. Cl.
CPC ........... *H05K 3/4644* (2013.01); *H05K 1/185* (2013.01); *H05K 3/0047* (2013.01); *H05K 3/4697* (2013.01)

(58) Field of Classification Search
CPC ...... H05K 1/185; H05K 1/186; H05K 3/0047; H05K 3/4602; H05K 3/4644; H05K 3/4685; H05K 3/4697
See application file for complete search history.

(56) References Cited

U.S. PATENT DOCUMENTS

| | | | |
|---|---|---|---|
| 2002/0031867 A1 | 3/2002 | Horiuchi et al. | |
| 2010/0078205 A1* | 4/2010 | Sakai | ..................... H05K 1/184 |
| | | | 156/247 |

(Continued)

FOREIGN PATENT DOCUMENTS

| | | |
|---|---|---|
| JP | 1980053492 A | 4/1980 |
| JP | 2002093831 A | 3/2002 |

(Continued)

OTHER PUBLICATIONS

Taiwan Intellectual Property Office. Office Action for TW Application No. 111142820 with English translation, mailed Sep. 7, 2023. pp. 1-5.

(Continued)

*Primary Examiner* — Timothy J Thompson
*Assistant Examiner* — Rhadames Alonzo Miller
(74) *Attorney, Agent, or Firm* — The Dobrusin Law Firm, P.C.

(57) ABSTRACT

A method for manufacturing a packaging substrate, and a packaging substrate are disclosed. The method includes: providing a bottom board with a first circuit layer, the first circuit layer being provided with at least one demand point, and one side of the demand point being provided with a first to-be-avoided region; machining a first intermediate insulating layer on the bottom board, the first intermediate insulating layer including a first intermediate insulating dielectric covering the first to-be-avoided region; machining a first intermediate wiring layer on the first intermediate insulating layer, the first intermediate wiring layer including a first intermediate circuit partially arranged on the first intermediate insulating dielectric and connected to the demand point; machining a first insulating layer on the first intermediate wiring layer which is stacked on the bottom board and covers the first intermediate wiring layer; and (Continued)

machining a circuit build-up layer on the first insulating layer.

7 Claims, 5 Drawing Sheets

(56) References Cited

U.S. PATENT DOCUMENTS

| | | | | |
|---|---|---|---|---|
| 2010/0122838 A1* | 5/2010 | Asami | H01L 23/49822 | 174/255 |
| 2010/0307808 A1* | 12/2010 | Horiuchi | H05K 3/4605 | 174/264 |
| 2012/0129298 A1* | 5/2012 | Lin | H01L 23/5389 | 438/118 |
| 2013/0032938 A1* | 2/2013 | Lin | H01L 23/49827 | 257/737 |
| 2013/0105201 A1* | 5/2013 | Ryu | H05K 1/185 | 29/841 |
| 2014/0070396 A1* | 3/2014 | Kyozuka | H01L 23/5389 | 257/698 |
| 2015/0342046 A1* | 11/2015 | Kim | C25D 5/02 | 216/13 |
| 2016/0037645 A1* | 2/2016 | Lee | H05K 3/4697 | 29/846 |
| 2018/0247891 A1* | 8/2018 | Chiu | H01L 23/5226 | |
| 2020/0312733 A1* | 10/2020 | Yeh | H01L 25/0657 | |
| 2022/0276558 A1* | 9/2022 | Abe | H01L 21/4857 | |
| 2022/0310500 A1* | 9/2022 | Chang | H01L 23/49838 | |
| 2023/0010115 A1* | 1/2023 | Chen | H01L 21/4857 | |
| 2023/0060728 A1* | 3/2023 | Li | H01L 25/0657 | |

FOREIGN PATENT DOCUMENTS

| | | | |
|---|---|---|---|
| JP | 2006303202 | A | 11/2006 |
| JP | 2008270778 | A | 11/2008 |
| JP | 2010283056 | A | 12/2010 |
| JP | 2014056925 | A | 3/2014 |
| JP | 2015035560 | A | 2/2015 |
| JP | 2015213124 | A | 11/2015 |
| JP | 2016134622 | A | 7/2016 |
| JP | 2021077680 | A | 5/2021 |
| KR | 1020100000678 | A | 1/2010 |
| KR | 1020200122841 | A | 10/2010 |
| KR | 1020110045098 | A | 5/2011 |
| KR | 1020190107985 | A | 9/2019 |
| KR | 1020220006246 | A | 1/2022 |
| WO | 2018066324 | A1 | 4/2018 |

OTHER PUBLICATIONS

Korean Intellectual Property Office. Request for the Submission of an Opinion for KR Application No. 10-2022-0182770 with English translation, mailed Aug. 7, 2024. pp. 1-6.
Korean Intellectual Property Office. Written Decision on Registration for KR Application No. 10-2022-0182770 with English translation, mailed May 31, 2025. pp. 1-3.
Japan Patent Office. First Notice of Reasons for Refusal for JP Application No. 2023-000467 with English translation, mailed Apr. 2, 2024. pp. 1-3.
Japan Patent Office. Second Notice of Reasons for Refusal for JP Application No. 2023-000467 with English translation, mailed Nov. 5, 2024. pp. 1-3.
Japan Patent Office. Decision to Grant a Patent for JP Application No. 2023-000467 with English translation, mailed Jan. 28, 2025. pp. 1-3.

* cited by examiner

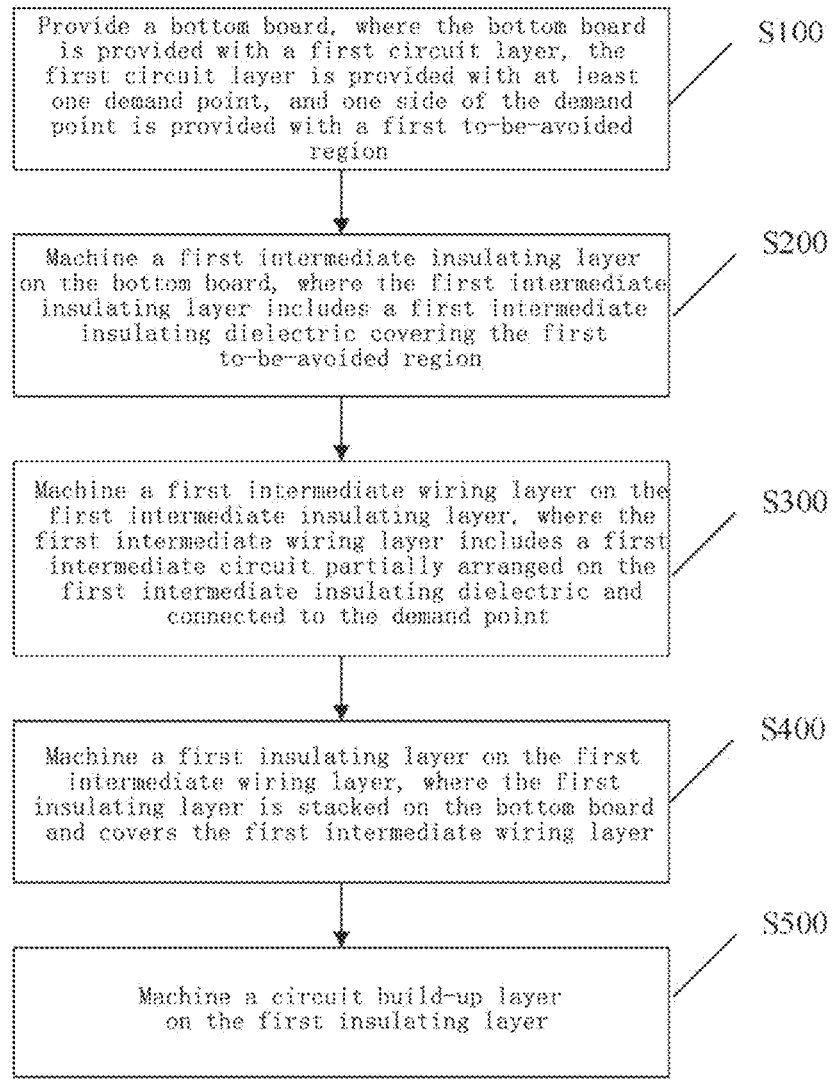

Provide a bottom board, where the bottom board is provided with a first circuit layer, the first circuit layer is provided with at least one demand point, and one side of the demand point is provided with a first to-be-avoided region — S100

Machine a first intermediate insulating layer on the bottom board, where the first intermediate insulating layer includes a first intermediate insulating dielectric covering the first to-be-avoided region — S200

Machine a first intermediate wiring layer on the first intermediate insulating layer, where the first intermediate wiring layer includes a first intermediate circuit partially arranged on the first intermediate insulating dielectric and connected to the demand point — S300

Machine a first insulating layer on the first intermediate wiring layer, where the first insulating layer is stacked on the bottom board and covers the first intermediate wiring layer — S400

Machine a circuit build-up layer on the first insulating layer — S500

FIG. 1

METHOD FOR MANUFACTURING A PACKAGING SUBSTRATE, AND PACKAGING SUBSTRATE

CROSS-REFERENCE TO RELATED APPLICATION

This application is based on and claims the benefit of priority from Chinese Patent Application No. 2022100694286, filed on 20 Jan. 2022, the entirety of which is incorporated by reference herein.

TECHNICAL FIELD

The disclosure relates to the technical field of semiconductor packaging, and more particularly, to a method for manufacturing a packaging substrate, and a packaging substrate.

BACKGROUND

In the related technology of semiconductor packaging, metal circuits are generally arranged in different circuit layers, adjacent circuit layers are isolated by an insulating dielectric layer, and the metal circuits in the same circuit layer are located in the same wiring plane. When there is an obstacle region between two demand points located in the same circuit layer, the related technology generally comprises extending a connecting circuit to avoid the obstacle region, or arranging the connecting circuits in the adjacent circuit layers and connecting the connecting circuits through an interlayer via to avoid the obstacle region. The former will increase the circuit wiring area and the wiring difficulty, while the latter can only realize wiring after layer adding, making the packaging substrate become thicker, and the interlayer via needs to be machined, thus increasing the design difficulty.

SUMMARY

The disclosure aims to solve at least one of the technical problems in the existing technology. Therefore, the disclosure provides a method for manufacturing a packaging substrate and a packaging substrate, which can improve wiring density.

In a first aspect, an embodiment of the disclosure provides a method for manufacturing a packaging substrate, which comprises:

providing a bottom board, wherein the bottom board is provided with a first circuit layer, the first circuit layer is provided with at least one demand point, and one side of the demand point is provided with a first to-be-avoided region;

machining a first intermediate insulating layer on the bottom board, wherein the first intermediate insulating layer comprises a first intermediate insulating dielectric covering the first to-be-avoided region;

machining a first intermediate wiring layer on the first intermediate insulating layer, wherein the first intermediate wiring layer comprises a first intermediate circuit partially arranged on the first intermediate insulating dielectric and connected to the demand point;

machining a first insulating layer on the first intermediate wiring layer, wherein the first insulating layer is stacked on the bottom board and covers the first intermediate wiring layer; and machining a circuit build-up layer on the first insulating layer.

According to some embodiments of the disclosure, before providing the bottom board, the method further comprises:

providing a chip board having two opposite surfaces, wherein the chip board is provided with a package cavity extending across the two opposite surfaces of the chip board;

machining a temporary bearing surface on the chip board and at a bottom portion of the package cavity;

adhering an electronic component in the package cavity, wherein an active surface of the electronic component is connected with the temporary bearing surface;

packaging the package cavity with a packaging material;

removing the temporary bearing surface to expose a connection terminal on the active surface of the electronic component; and machining the first circuit layer on the chip board to form the bottom board, wherein at least one demand point is connected with the connection terminal on the active surface of the electronic component.

According to some embodiments of the disclosure, before providing the bottom board, the method further comprises:

providing a chip board having two opposite surfaces, wherein the chip board is provided with a package cavity extending across the two opposite surfaces of the chip board;

machining a temporary bearing surface on the chip board and at a bottom portion of the package cavity;

adhering an electronic component in the package cavity, wherein the electronic component is provided with an active surface and a passive surface which are opposite to each other, and the passive surface of the electronic component is connected with the temporary bearing surface; packaging the package cavity with a packaging material to form a first package body;

machining a via in the first package body, wherein the via is connected to a connection terminal on the active surface of the electronic component; and machining the first circuit layer on the chip board to form the bottom board, wherein at least one demand point is connected with the via.

According to some embodiments of the disclosure, the bottom board is provided with a package cavity located in the first to-be-avoided region, the electronic component is packaged in the package cavity, and the machining a first intermediate insulating layer on the bottom board comprises:

machining the first intermediate insulating dielectric on the bottom board and at a position corresponding to the first to-be-avoided region, wherein the first intermediate insulating dielectric covers the package cavity; and forming a window in the first intermediate insulating dielectric to expose the electronic component.

According to some embodiments of the disclosure, the machining a first intermediate insulating layer on the bottom board comprises:

machining a photosensitive insulating dielectric material on the bottom board;

carrying out pattern transfer on the photosensitive insulating dielectric material to retain a part of the photosensitive insulating dielectric material on the first to-be-avoided region; and curing the photosensitive insulating dielectric material subjected to the pattern transfer to obtain the first intermediate insulating dielectric, so as to form the first intermediate insulating layer.

According to some embodiments of the disclosure, the photosensitive insulating dielectric material is a dry-film photosensitive insulating dielectric material, and the machining a photosensitive insulating dielectric material on the bottom board comprises: pressing the dry-film photosensitive insulating dielectric material on the bottom board, wherein the dry-film photosensitive insulating dielectric material covers the first circuit layer; or the photosensitive insulating dielectric material is a liquid photosensitive insulating dielectric material, and the machining a photosensitive insulating dielectric material on the bottom board comprises: coating the liquid photosensitive insulating dielectric material on the bottom board, wherein the liquid photosensitive insulating dielectric material covers the first circuit layer.

In another aspect, an embodiment of the disclosure provides a packaging substrate manufactured by the method for manufacturing a packaging substrate above.

In yet another aspect, an embodiment of the disclosure provides a packaging substrate, which comprises:

a bottom board provided with a first circuit layer, wherein the first circuit layer is provided with at least one demand point, and one side of the demand point is provided with a first to-be-avoided region; a first intermediate insulating layer arranged on the bottom board, wherein the first intermediate insulating layer comprises a first intermediate insulating dielectric covering the first to-be-avoided region; a first intermediate wiring layer comprising a first intermediate circuit layer, wherein the first intermediate circuit is partially arranged on the first intermediate insulating dielectric and connected to the demand point; a first insulating layer stacked on the bottom board and covering the first intermediate wiring layer; and a circuit build-up layer arranged on the first insulating layer.

According to some embodiments of the disclosure, an electronic component is packaged in the bottom board, and the at least one demand point is connected to a connection terminal on an active surface of the electronic component.

According to some embodiments of the disclosure, at least one of a circuit, a bonding pad or an electronic component is arranged in the first to-be-avoided region.

The embodiments of the disclosure at least have the following beneficial effects. According to embodiments of the disclosure, the first intermediate wiring layer can be machined between two adjacent circuit layers, so that local staggered-layer wiring is realized, and a thinner build-up layer structure can be realized, thus being beneficial for increasing wiring density.

Additional aspects and advantages of the disclosure will be given in part in the following description, which will become apparent from the following description or be understood through practice of the disclosure.

BRIEF DESCRIPTION OF THE DRAWINGS

The above and/or additional aspects and advantages of the disclosure will become apparent and easy to understand from the description of embodiments with reference to the following drawings, wherein:

FIG. 1 is a flow chart of steps of a method for manufacturing a packaging substrate according to an embodiment of the disclosure;

DETAILED DESCRIPTION

Figure 2:
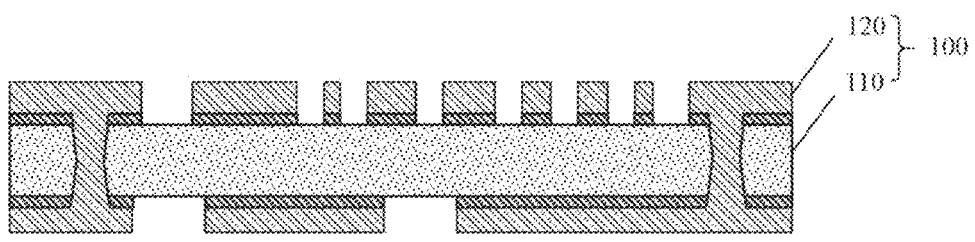
FIG. 2, FIG. 3, FIG. 4, FIG. 5, and FIG. 6 are schematic structural diagrams of a packaging substrate in the middle processes of the method for manufacturing a packaging substrate shown in FIG. 1.

Embodiments of the disclosure are described in detail hereinafter. Examples of the embodiments are shown in the drawings. The same or similar reference numerals throughout the drawings denote the same or similar elements or elements having the same or similar functions. The embodiments described hereinafter with reference to the drawings are exemplary, are only intended to explain the disclosure, and cannot be construed as limiting the disclosure.

In the description of the disclosure, the term "several" refers to being one or more, the term "multiple" refers to being two or more, and the terms "greater than", "less than", "more than", and the like are understood as not including the number that follows, while the terms "above", "below", "within", and the like are understood as including the number that follows. If there are the descriptions of "first", "second, and the like, it is only for the purpose of distinguishing between technical features, and should not be understood as indicating or implying relative importance, implicitly indicating the number of the indicated technical features or implicitly indicating the order of the indicated technical features.

In the description of the disclosure, unless otherwise clearly defined, the terms "setting", "connection", and the like should be understood broadly, and those having ordinary skills in the art can reasonably determine the specific meanings of the above terms in the disclosure in combination with the specific contents of the technical solutions.

In the description of the embodiment, the method steps are continuously numbered for convenience of examination and understanding. In combination with the overall technical solution of the embodiments and the logical relationship between the steps, the adjustment of implementation sequence for the steps will not affect the technical effect achieved by the technical solution of the disclosure.

Figure 3:
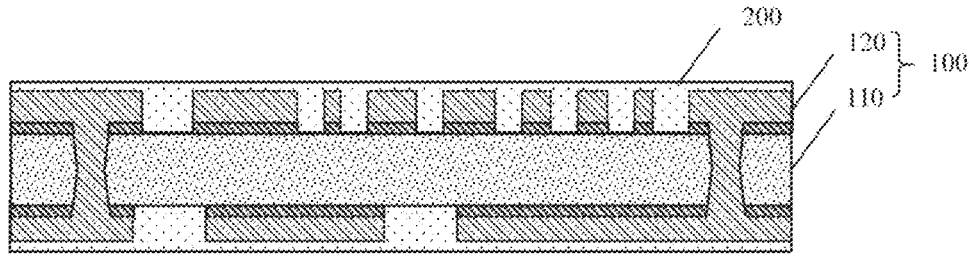
Figure 4:
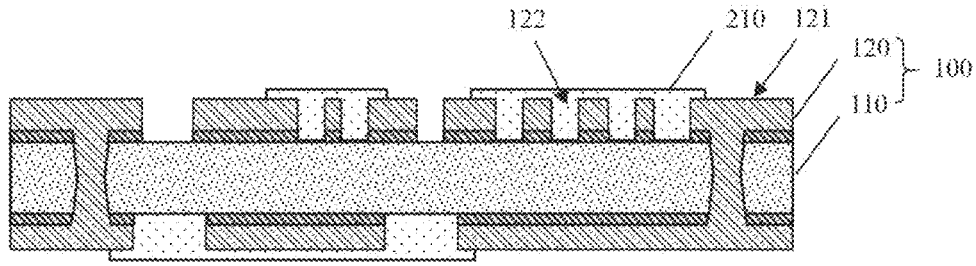
Figure 5:
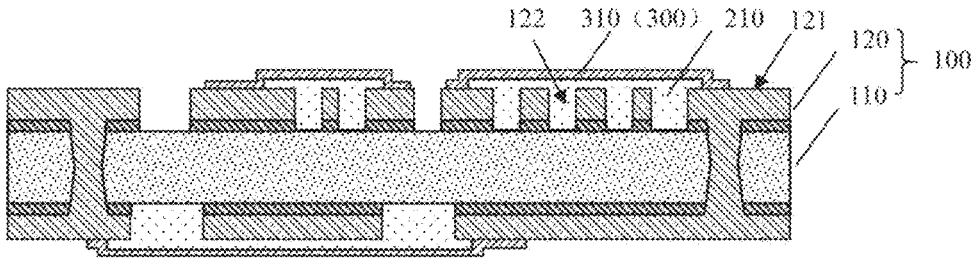
Figure 6:
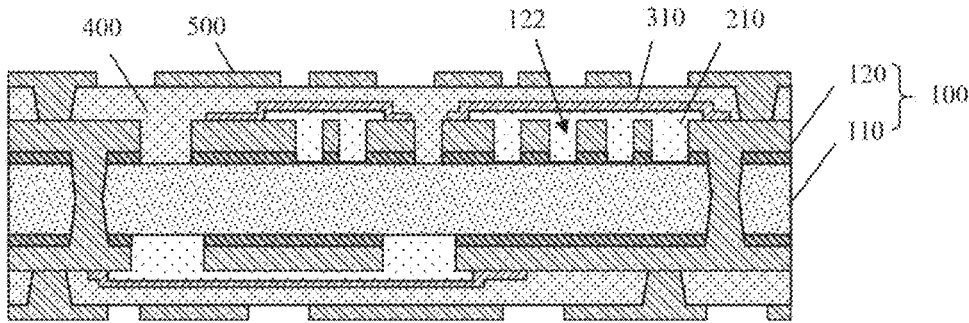

With reference to FIG. 1, embodiments of the disclosure provide a method for manufacturing a packaging substrate, which comprises steps of:

S100: with reference to FIG. 2, providing a bottom board 100, wherein the bottom board 100 is provided with a first circuit layer 120, the first circuit layer 120 is provided with at least one demand point 121, and one side of the demand point 121 is provided with a first to-be-avoided region 122;

S200: with reference to FIG. 3 and FIG. 4, machining a first intermediate insulating layer 200 on the bottom board 100, wherein the first intermediate insulating layer 200 comprises a first intermediate insulating dielectric 210, and the first intermediate insulating dielectric 210 covers the first to-be-avoided region 122;

S300: with reference to FIG. 5, machining a first intermediate wiring layer 300 on the first intermediate insulating layer 200, wherein the first intermediate wiring layer 300 comprises a first intermediate circuit 310, and the first intermediate circuit 310 is partially arranged on the first intermediate insulating dielectric 210 and connected to the demand point 121;

S400: with reference to FIG. 6, machining a first insulating layer 400 on the first intermediate wiring layer 300, wherein the first insulating layer 400 is stacked on the bottom board 100 and covers the first intermediate wiring layer 300; and S500: with reference to FIG. 6, machining a circuit build-up layer 500 on the first insulating layer 400.

With reference to FIG. 2 to FIG. 6, the bottom board 100 in some embodiments may be a single-sided board, a double-sided board or a multi-layer board. For the single-sided board, the first circuit layer 120 is a single-sided wiring structure, which means that the bottom board 100 comprises a chip board 110 and the first circuit layer 120, and the first circuit layer 120 is arranged on one surface of the chip board 110. For the double-sided board, the first circuit layer 120 is a double-sided wiring structure, which means that the bottom board 100 comprises the chip board 110 and the first circuit layers 120 arranged on two opposite surfaces of the chip board 110, and the first circuit layers 120 located on different surfaces of the chip board 110 are connected through an interlayer conduction structure, wherein the interlayer conduction structure may be a structure such as a copper pillar or a via. For the multi-layer board, the bottom board 100 comprises the chip board 110, an inner circuit layer and the first circuit layer 120 which are laminated in sequence, and similar to the single-sided board or the double-sided board, the inner circuit layer and the first circuit layer 120 may be the single-sided wiring structure or the double-sided wiring structure.

In circuit wiring, shortening wiring spacing is one of the means to increase wiring density and realize miniaturization design. However, it is found in an actual wiring process that, for a certain demand point 121, such as an end portion of a circuit, a bonding pad or a connection terminal of an electronic component embedded in the bottom board 100, a wiring structure such as the circuit, the bonding pad or a heat dissipation block is arranged around the demand point 121 due to a limited wiring area, so that the demand point 121 cannot be subjected to circuit extension or circuit connection with other demand points 121. Therefore, a region where the structure such as the circuit, the bonding pad or the heat dissipation block is located outside the demand point 121 needs to be regarded as the first to-be-avoided region 122, so as to facilitate wiring avoidance.

For a limited planar wiring space, it is difficult to optimize the circuit wiring. Therefore, the wiring space is changed from the planar wiring space to a three-dimensional wiring space in the embodiments of the disclosure, and the first intermediate insulating dielectric 210 covers the first to-be-avoided region 122, so that a new wiring region is machined on the first to-be-avoided region 122, thus realizing local staggered-layer wiring. Moreover, a height of the first intermediate insulating layer 200 relative to a surface of the bottom board 100 is larger than that of the first circuit layer 120 and less than that of the subsequent first insulating layer 400. Compared with a method of arranging connecting circuits in adjacent circuit layers in the related technology, a wiring space in a thickness direction is fully utilized in the embodiments of the disclosure, and wiring is carried out between adjacent circuit layers, thus realizing a thinner layer build-up structure, and reducing a thickness of the packaging substrate while meeting requirement of high-density wiring. It should be noted that, according to actual application requirements, shape and area of the first intermediate insulating dielectric 210 may be adaptively adjusted. For example, shape of a planar projection of the first intermediate insulating dielectric 210 on the bottom board 100 may be square, circular, annular or irregular.

Figure 7:
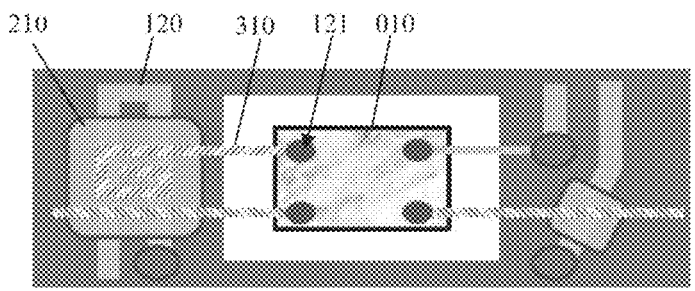
FIG. 7 is a first schematic planar view of the packaging substrate according to an embodiment of the disclosure.
Figure 8:
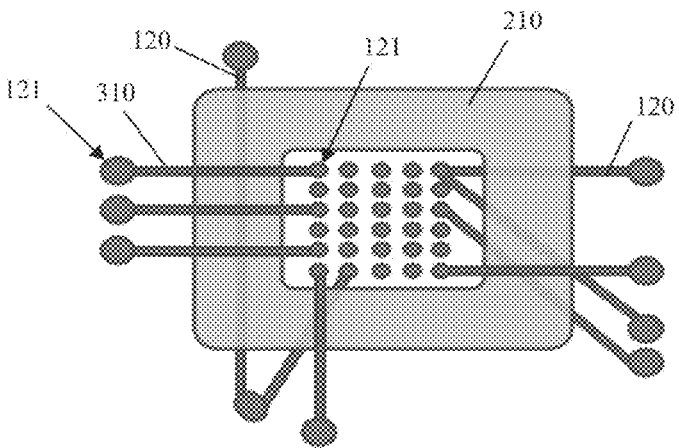
FIG. 8 is a second schematic planar view of the packaging substrate according to an embodiment of the disclosure.

The first intermediate wiring layer 300 is machined on the first intermediate insulating layer 200 in the embodiments of the disclosure, and the first intermediate circuit 310 and the first circuit layer 120 may be isolated through the first intermediate insulating dielectric 210, thus meeting wiring requirement. It is worth understanding that the wiring method of the first intermediate circuit 310 may be flexibly adjusted according to actual application. For example, with reference to FIG. 7 and FIG. 8, one, two, three or more demand points 121 may be provided, the first intermediate circuit 310 is a loop-shaped structure, a straight-circuit structure, a T-shaped structure or a branched structure with multiple end portions, the first intermediate circuit 310 is arranged on the first intermediate insulating dielectric 210, and an end portion of the first intermediate circuit 310 is connected with the demand point 121. It should be noted that the first intermediate wiring layer 300 may be machined by a Tenting masking method, a semi-additive process (SAP) or a modified semi-additive process (MSAP). Compared with the method of arranging the connecting circuits in the adjacent circuit layers, the first intermediate circuit 310 in the embodiments of the disclosure can be directly connected with the demand point 121, and the interlayer conduction structure such as the via or the copper pillar can be omitted, thus omitting the manufacturing process of the interlayer conduction structure, and being beneficial for improving manufacturing efficiency and saving manufacturing cost.

After manufacturing the first intermediate wiring layer 300, the first insulating layer 400 may be machined on the first intermediate wiring layer 300 by laminating and pressing, and the circuit build-up layer 500 may be machined on the first insulating layer 400, thus manufacturing multiple layers of circuits.

Figure 9:
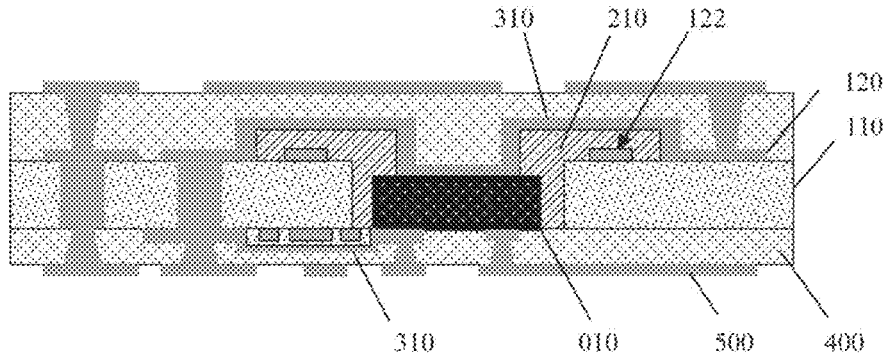
FIG. 9 is a first schematic cross-sectional view of the packaging substrate according to an embodiment of the disclosure.

With reference to FIG. 9, in some application examples, in order to improve functional diversity of the packaging substrate, an electronic component 010 needs to be embedded in the bottom board 100, and the electronic component 010 may be an active component such as a chip, or a passive component such as a resistor. Therefore, before providing the bottom board 100, the method for manufacturing a packaging substrate further comprises:

S011: providing a chip board 110 having two opposite surfaces, wherein the chip board 110 is provided with a package cavity extending across the two opposite surfaces of the chip board 110;

S012: machining a temporary bearing surface (not shown in the drawing) on the chip board 110 and at a bottom portion of the package cavity, such as adhering gummed paper or adhesive tape to the chip board 110 to form the temporary bearing surface at the bottom portion of the package cavity;

S013: adhering an electronic component 010 in the package cavity, wherein an active surface of the electronic component 010 is connected with the temporary bearing surface;

S014: packaging the package cavity with a packaging material, wherein the packaging material is a photosensitive dielectric material, such as a dry-film photosensitive dielectric material or a liquid photosensitive dielectric material. By packaging the electronic component 010 in the package cavity with the packaging material, embedding process for the electronic component 010 can be achieved, thus reducing occupation of the planar wiring space by the electronic component 010, and being beneficial for increasing integration density;

S015: removing the temporary bearing surface to expose a connection terminal on the active surface of the electronic component 010; and S016: machining the first circuit layer 120 on the chip board 110 to form the bottom board 100, wherein at least one demand point 121 is connected with the connection terminal on the active surface of the electronic component 010. It should be noted that, before machining the first circuit layer 120, a via may be machined by drilling out a hole on the chip board 110, such as by laser drilling or mechanical drilling, and then perform electroplating process on the hole to form the via. Certainly, the copper pillar may be prefabricated on the chip board 110 to realize interlayer conduction.

In the application example, the connection terminal on the active surface of the electronic component 010 is connected with the demand point 121, and the first intermediate wiring layer 300 may be machined on the first intermediate insulating layer 200, thus avoiding the wiring structure around the electronic component 010, and realizing flexible wiring of the electronic component 010.

In other application examples (not shown in the drawings), the electronic component 010 also needs to be embedded in the bottom board 100, but different from the above application example, the electronic component 010 is attached in an orientation such that the passive surface thereof is connected with the temporary bearing surface. Therefore, before providing the bottom board 100, the method for manufacturing a packaging substrate further comprises:

S021: providing a chip board 110 having two opposite surfaces, wherein the chip board 110 is provided with a package cavity extending across the two opposite surfaces of the chip board 110;

S022: machining a temporary bearing surface on the chip board 110 and at a bottom portion of the package cavity, such as adhering gummed paper or adhesive tape to the chip board 110 to form the temporary bearing surface at the bottom portion of the package cavity;

S023: adhering an electronic component 010 in the package cavity, wherein the electronic component 010 is provided with an active surface and a passive surface which are opposite to each other, and the passive surface of the electronic component 010 is connected with the temporary bearing surface;

S024: packaging the package cavity with a packaging material to form a first package body;

S025 machining a via in the first package body, wherein the via is connected to a connection terminal on the active surface of the electronic component 010, wherein the via may be obtained by mechanical drilling or laser drilling to obtain a hole, and performing electroplating process on the hole; and S026: machining the first circuit layer 120 on the chip board 110 to form the bottom board 100, wherein at least one demand point 121 is connected with the via.

In other application examples, the package cavity located in the first to-be-avoided region 122 is arranged on the bottom board 100, the electronic component 010 is packaged in the package cavity, and the machining the first intermediate insulating layer 200 on the bottom board 100 comprises:

S031: machining the first intermediate insulating dielectric 210 on the bottom board 100 and at a position corresponding to the first to-be-avoided region 122, wherein the first intermediate insulating dielectric 210 covers the package cavity; and S032: forming a window in the first intermediate insulating dielectric 210 to expose the electronic component 010.

Figure 10:
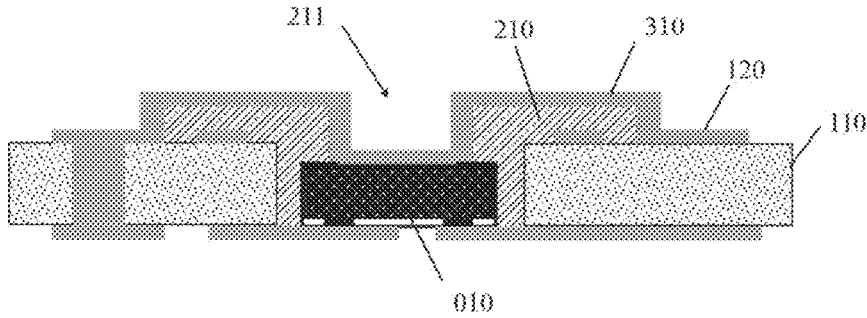
FIG. 10 is a second schematic cross-sectional view of the packaging substrate according to an embodiment of the disclosure.

With reference to FIG. 10, by forming a window in the first intermediate insulating dielectric 210, a concave cavity 211 can be formed in the first intermediate insulating dielectric 210. According to actual wiring requirements, the concave cavity 211 may be used for adjusting wiring of the first intermediate circuit 310, thus being beneficial for realizing flexible wiring.

In the above discussion, the machining the first intermediate insulating layer 200 on the bottom board 100 comprises:

S210: machining a photosensitive insulating dielectric material on the bottom board 100;

S220: carrying out pattern transfer on the photosensitive insulating dielectric material to retain a part of the photosensitive insulating dielectric material on the first to-be-avoided region 122, wherein the pattern transfer specifically comprises exposure and development of the photosensitive insulating dielectric material; and S230: curing the photosensitive insulating dielectric material subjected to the pattern transfer to obtain the first intermediate insulating dielectric 210, so as to form the first intermediate insulating layer 200.

Specifically, the photosensitive insulating dielectric material is a dry-film photosensitive insulating dielectric material, and the machining a photosensitive insulating dielectric material on the bottom board 100 comprises: pressing the dry-film photosensitive insulating dielectric material on the bottom board 100, wherein the dry-film photosensitive insulating dielectric material covers the first circuit layer 120.

Alternatively, the photosensitive insulating dielectric material is a liquid photosensitive insulating dielectric material, and the machining a photosensitive insulating dielectric material on the bottom board 100 comprises: coating the liquid photosensitive insulating dielectric material on the bottom board 100, wherein the liquid photosensitive insulating dielectric material covers the first circuit layer 120.

Embodiments of the disclosure further provide a packaging substrate manufactured by the method for manufacturing a packaging substrate above. The first intermediate wiring layer 300 can be machined between two adjacent circuit layers, so that local staggered-layer wiring is realized, and a thinner build-up layer structure can be realized, thus being beneficial for increasing wiring density.

Embodiments of the disclosure further provide a packaging substrate, which comprises a bottom board 100, a first intermediate insulating layer 200, a first intermediate wiring layer 300, a first insulating layer 400 and a circuit build-up layer. The bottom board 100 is provided with a first circuit layer 120, wherein the first circuit layer 120 is provided with at least one demand point 121, and one side of the demand point 121 is provided with a first to-be-avoided region 122. The first intermediate insulating layer 200 is arranged on the bottom board 100, wherein the first intermediate insulating layer 200 comprises a first intermediate insulating dielectric 210, and the first intermediate insulating dielectric 210 covers the first to-be-avoided region 122. The first intermediate wiring layer 300 comprises a first intermediate circuit layer 310, wherein the first intermediate circuit 310 is partially arranged on the first intermediate insulating dielectric 210 and connected to the demand point 121. The first insulating layer 400 is stacked on the bottom board 100 and covers the first intermediate wiring layer 300. The circuit build-up layer 500 is arranged on the first insulating layer 400.

In the embodiments of the disclosure, the first intermediate wiring layer 300 can be machined between two adjacent circuit layers, so that local staggered-layer wiring is realized, and a thinner build-up layer structure can be realized, thus being beneficial for increasing wiring density.

The electronic component 010 is packaged in the bottom board 100, and at least one demand point 121 is connected to the connection terminal on the active surface of the electronic component 010, so that the wiring structure around the electronic component 010 can be avoided by arranging the first intermediate circuit 310 on the first intermediate insulating layer 200, thus realizing flexible wiring of the electronic component 010.

At least one of a circuit, a bonding pad or an electronic component 010 is arranged in the first to-be-avoided region 122. The first insulating dielectric covers the first to-be-avoided region 122, and can isolate the first intermediate circuit 310 from the circuit, the bonding pad or the electronic component 010 in the first to-be-avoided region 122, thus realizing flexible wiring and increasing wiring density.

The embodiments of the disclosure are described in detail with reference to the drawings above, but the disclosure is not limited to the above embodiments, and various changes may also be made within the knowledge scope of those of ordinary skills in the art without departing from the purpose of the disclosure.

What is claimed is:

1. A method for manufacturing a packaging substrate, comprising:

providing a bottom board, wherein the bottom board is provided with a first circuit layer, the first circuit layer is provided with at least a first demand point and a second demand point, and a first to-be-avoided region is provided between the first demand point and the second demand point;

machining a first intermediate insulating layer on the bottom board, wherein the first intermediate insulating layer comprises a first intermediate insulating dielectric covering the first to-be-avoided region;

machining a first intermediate wiring layer on the first intermediate insulating layer, wherein the first intermediate wiring layer comprises a first intermediate circuit partially arranged on the first intermediate insulating dielectric, and connecting the first demand point with the second demand point through the first intermediate circuit;

stacking a first insulating layer on the bottom board to cover the first intermediate wiring layer, a lower surface of the first insulating layer being coplanar with the bottom board; and machining a circuit build-up layer on the first insulating layer.

2. The method for manufacturing a packaging substrate according to claim 1, wherein before providing the bottom board, the method further comprises:

providing a chip board having two opposite surfaces, wherein the chip board is provided with a package cavity extending across the two opposite surfaces of the chip board;

machining a temporary bearing surface on the chip board and at a bottom portion of the package cavity;

adhering an electronic component in the package cavity, wherein an active surface of the electronic component is connected with the temporary bearing surface;

packaging the package cavity with a packaging material;

removing the temporary bearing surface to expose a connection terminal on the active surface of the electronic component; and machining the first circuit layer on the chip board to form the bottom board, wherein at least one of the first demand point and the second demand point is connected with the connection terminal on the active surface of the electronic component.

3. The method for manufacturing a packaging substrate according to claim 1, wherein before providing the bottom board, the method further comprises:

providing a chip board having two opposite surfaces, wherein the chip board is provided with a package cavity extending across the two opposite surfaces of the chip board;

machining a temporary bearing surface on the chip board and at a bottom portion of the package cavity;

adhering an electronic component in the package cavity, wherein the electronic component is provided with an active surface and a passive surface which are opposite to each other, and the passive surface of the electronic component is connected with the temporary bearing surface;

packaging the package cavity with a packaging material to form a first package body;

machining a via in the first package body, wherein the via is connected to a connection terminal on the active surface of the electronic component; and machining the first circuit layer on the chip board to form the bottom board, wherein at least one of the first demand point and the second demand point is connected with the via.

4. The method for manufacturing a packaging substrate according to claim 1, wherein the bottom board is provided with a package cavity located in the first to-be-avoided region, the electronic component is packaged in the package cavity, and the machining a first intermediate insulating layer on the bottom board comprises:

machining the first intermediate insulating dielectric on the bottom board and at a position corresponding to the first to-be-avoided region, wherein the first intermediate insulating dielectric covers the package cavity; and forming a window in the first intermediate insulating dielectric to expose the electronic component.

5. The method for manufacturing a packaging substrate according to claim 1, wherein the machining a first intermediate insulating layer on the bottom board comprises:

machining a photosensitive insulating dielectric material on the bottom board;

carrying out pattern transfer on the photosensitive insulating dielectric material to retain a part of the photosensitive insulating dielectric material on the first to-be-avoided region; and curing the photosensitive insulating dielectric material subjected to the pattern transfer to obtain the first intermediate insulating dielectric, so as to form the first intermediate insulating layer.

6. The method for manufacturing a packaging substrate according to claim 5, wherein, the photosensitive insulating dielectric material is a dry-film photosensitive insulating dielectric material, and the machining a photosensitive insulating dielectric material on the bottom board comprises: pressing the dry-film photosensitive insulating dielectric material on the bottom board, wherein the dry-film photosensitive insulating dielectric material covers the first circuit layer; or the photosensitive insulating dielectric material is a liquid photosensitive insulating dielectric material, and the machining a photosensitive insulating dielectric material on the bottom board comprises: coating the liquid photosensitive insulating dielectric material on the bottom board, wherein the liquid photosensitive insulating dielectric material covers the first circuit layer.

7. A packaging substrate manufactured by the method for manufacturing a packaging substrate according to claim 1.

* * * * *